United States Patent [19]

Abbas et al.

[11] Patent Number: 4,849,800
[45] Date of Patent: Jul. 18, 1989

[54] SEMICONDUCTOR COMPONENT

[75] Inventors: C. Christiaan Abbas, Baden; Jens Gobrecht, Gebenstorf; Jan Voboril, Nussbaumen; Horst Grüning, Baden, all of Switzerland

[73] Assignee: BBC Brown Boveri AG, Baden, Switzerland

[21] Appl. No.: 98,086

[22] Filed: Sep. 18, 1987

[30] Foreign Application Priority Data

Oct. 1, 1986 [CH] Switzerland .................. 3919/86

[51] Int. Cl.$^4$ .............................................. H01L 29/74
[52] U.S. Cl. ...................................... 357/38; 357/55; 357/81
[58] Field of Search ............... 357/55, 38, 38 A, 38 B, 357/38 C, 38 G, 65, 81

[56] References Cited

U.S. PATENT DOCUMENTS 3,553,536  1/1971  Neilson ................................ 357/64
3,769,563  10/1973  Kirishins et al. ..................... 357/55

FOREIGN PATENT DOCUMENTS 632366   12/1961  Canada ................................ 357/38
0029932  6/1981   European Pat. Off. .
0064231  11/1982  European Pat. Off. .
0066721  12/1982  European Pat. Off. .
0082419  6/1983   European Pat. Off. .
0121068  10/1984  European Pat. Off. .
1208409  1/1966   Fed. Rep. of Germany ........ 357/55
56-76568 6/1981   Japan .................................. 357/38

OTHER PUBLICATIONS

Patent Abstracts of Japan, vol. 5, No. 141 (E-73) (813) Sep. 5, 1981 & JP A 5676568 (Mitsubishi Denki K.K.) Jun. 24, 1981.

Primary Examiner—William D. Larkins
Attorney, Agent, or Firm—Oblon, Spivak, McClelland, Maier & Neustadt

[57] ABSTRACT

In a semiconductor component, which has various differently doped layers (2, 3, 4, 5) within a semiconductor substrate, an improvement of the electrical properties is achieved, wherein the thickness of the substrate in the current-carrying region is locally reduced by a deep etch well (10), the original mechanical stability of the semiconductor substrate largely remaining retained.

4 Claims, 3 Drawing Sheets

U.S. Patent   Jul. 18, 1989   Sheet 3 of 3   4,849,800
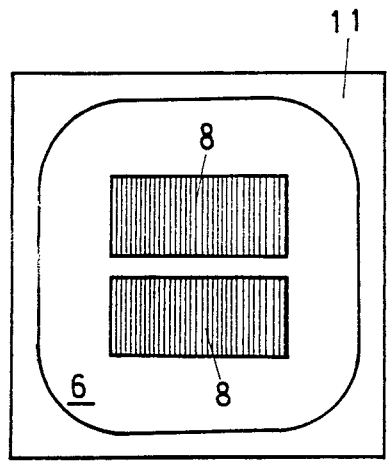
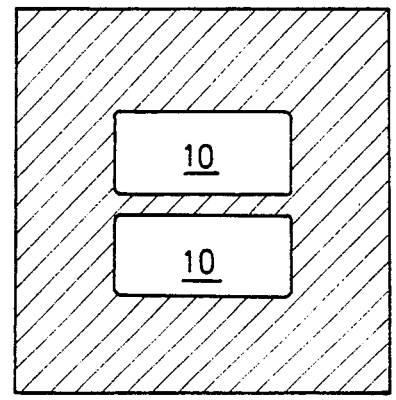
FIG.5A   FIG.5B
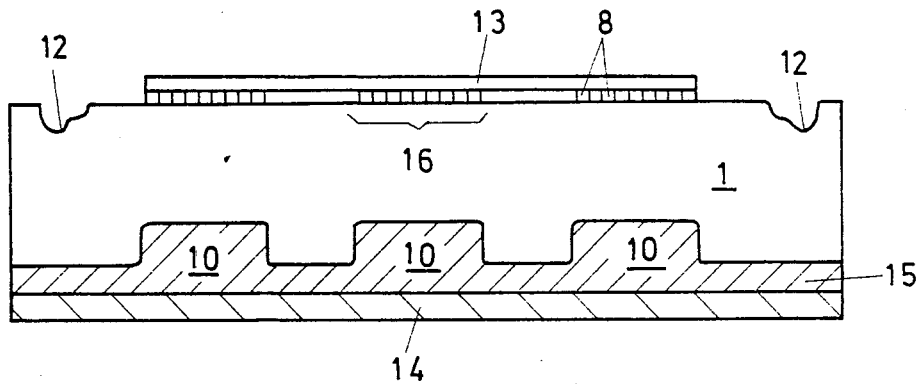
FIG.6

SEMICONDUCTOR COMPONENT

TITLE OF THE INVENTION

1. Field of the Invention

The present invention relates to a semiconductor component. It relates in particular to a semiconductor component with a large-area semiconductor substrate which has a multiplicity of differently doped layers between oppositely situated electrodes.

2. Description of the Background

Semiconductor components in the form of diodes or thyristors, but also MOSFETs or high-current transistors, in particular for high powers, are capturing ever larger areas of energy generation and distribution, and of drive engineering.

At the same time new possibilities are being opened up by turn off thyristors such as are known as GTO (Gate Turn Off) thyristors or field-controlled thyristors (FCTh=Field Controlled Thyristor) for example from the EP-A No. 320,121,068.

Simulation calculations have now shown that a substantial improvement of the ON resistance (i.e. the resistance in the conducting state), the turn-off times and the so-called "tail" behaviour (i.e. the decay behaviour of the current during "snubberless" turn off) can be achieved for such GTOs and FCThs if the corresponding semiconductor substrate is constructed with a stop layer and a reduced thickness of the n-type base layer.

Reduction of the n-type base layer thickness to an extent which is effective for the electrical properties of the component cannot, however, be achieved if the conventional technology is used since the large-area semiconductor substrates, with their diameters of several inches, would then be much too fragile to be handled reliably in the component manufacture.

Even the use of epitaxially grown so-called EPI Layers would not be a solution since said EPI layers would have to embody the additional thickness for the raised cathode fingers, and EPI Layers with a total thickness of more than 100 $\mu$m necessary for this purpose will either not be capable of manufacture in the required quality or else would be at least uneconomically expensive.

SUMMARY OF THE INVENTION

The object of the invention is therefore to provide a semiconductor component in which the advantages of thickness reduction are achieved without impairing the mechanical stability of the semiconductor substrate or having to resort to uneconomical manufacturing methods.

The object is achieved in a semiconductor component of the type mentioned in the introduction, wherein, to improve the electrical properties, the thickness of the semiconductor substrate is reduced in the current-carrying region by a deep etch well introduced at least on one side of the semiconductor substrate. The essence of the invention is therefore to reduce the thickness only locally by introducing etch wells in the semiconductor substrate from one or both sides so that the original substrate thickness continues to be retained around the etch well in a ridgelike manner and ensures a sufficient mechanical stability.

Preferably, the invention is implemented in semiconductor components in which the semiconductor substrate has the layer series of a GTO or FCTh disposed between an anode and a cathode and has, on the cathode side, a gate-cathode structure, constructed in a stepped manner, in which a multiplicity of cathode fingers project out of more deeply located gate level and form a control structure with the intervening gate regions. In this case the etch well is disposed on the anode side opposite the control structure.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 5A shows the plan view of the cathode side of a finely patterned and passivated prototype of a thyristor which can be turned off having a multiplicity of parallel cathode fingers;

FIG. 5B shows the plan view of the anode side of a thyristor according to FIG. 5A with the etch wells situated opposite the control structure; and FIG. 6 shows the cross section through a thyristor which can be turned off having a control structure subdivided into several control zones according to a further preferred embodiment of the invention.

DESCRIPTION OF THE PREFERRED EMBODIMENTS

Although the invention is not restricted thereto, it will be described and explained below especially in connection with thyristors which can be turned off of the FCTh or GTO type.

Figure 1:
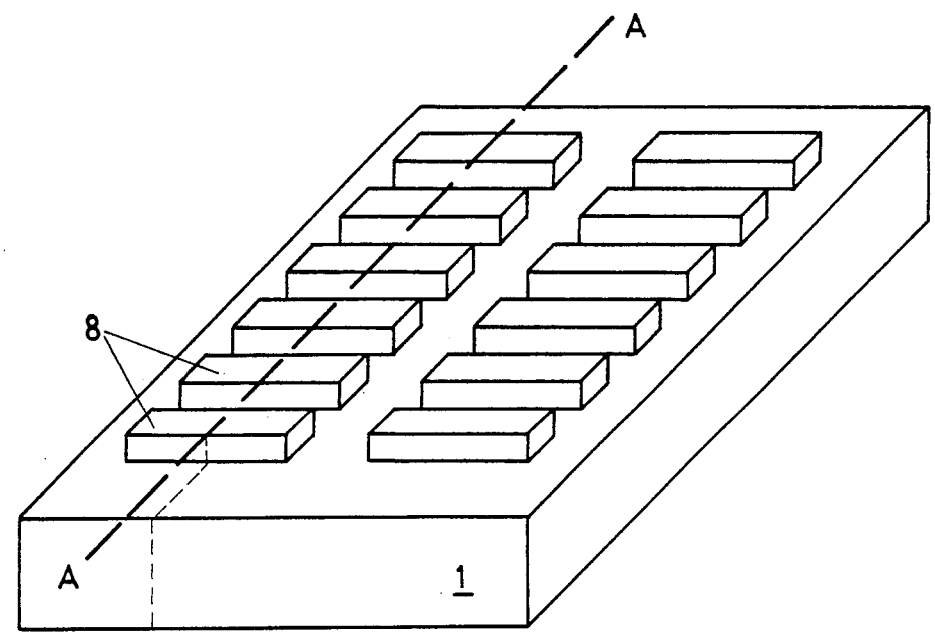
FIG. 1 shows an external view in perspective of a thyristor which can be turned off (GTO or FCTh) with step-like gate-cathode structure according to the prior art.

Referring now to the drawings, wherein like reference numerals designate identical or corresponding parts throughout the several views, FIG. 1 shows an external view in perspective of such a thyristor which can be switched off having stepLike gate-cathode structure as it is known from the EP-A1 No. 0,121,068.

The known thyristor comprises essentially a Large-area semiconductor substrate 1 with differently doped Layers, not shown in the Figure, between an anode and a cathode.

On the cathode side (upper side in FIG. 1) there may be seen, by way of example, two rows, each containing 6 parallel cathode fingers 8, which project above the more deeply located gate level which surrounds them. The cathode fingers 8 form, together with the intervening gate regions, a control structure by means of which the current flow through the thyristor may be turned on or off. At the same time, it is obvious that the current flow is essentially restricted to the region of the semiconductor substrate 1 which is defined by the cathode fingers 8.

The nature of the layer series in the interior of the semiconductor substrate 1 depends on whether it is a GTO or an FCTh type. Below, reference will be made by way of example to the GTO type. For this purpose, FIG. 2 shows the component from FIG. 1 in a cross section along the plane which is indicated in FIG. 1 by the Line A—A.

Figure 2:
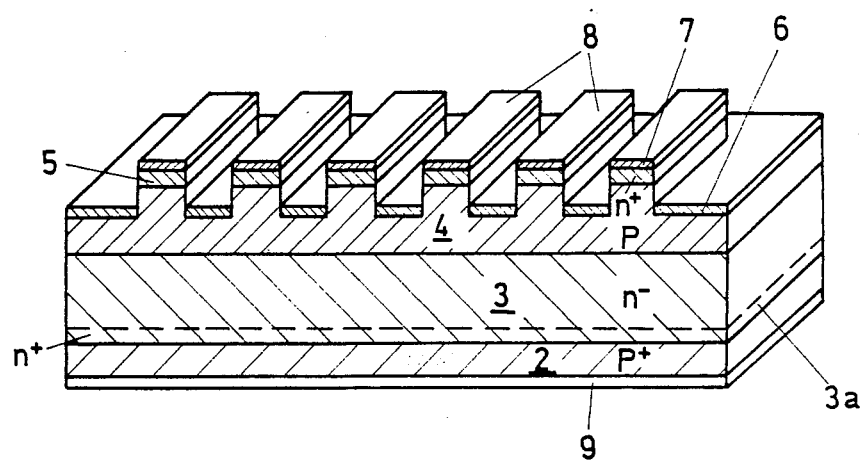
FIG. 2 shows the thyristor according to FIG. 1 (in this case specially as GTO) in cross section along the plane indicated by the Line A—A in FIG. 1.

In FIG. 2 it can be seen that, between a metallic anode 9 and a metallic cathode 7, which breaks down into individual regions corresponding to the cathode fingers 8, a p+-doped anode Layer 2, an n−-doped n-type base Layer 3, a p-doped p-base layer 4, and, in each of the cathode fingers 8, an n+-doped cathode Layer 5 are disposed on top of each other. Contact is made to the p-type base layer 4 on the more deeply located gate level by a metallic gate contact 6 which surrounds the cathode fingers and serves to control the component.

The operation of this GTO is described in the publication cited.

To improve the electrical properties, an additional n+-doped stop layer 3a, which is shown by a broken line in FIG. 2, may be provided in a manner known per se between the n-type base layer 3 and the anode layer 2.

As already mentioned, for a component as shown in FIG. 2 a suitable program has been used to carry out simulation calculations of the turn-off behaviour in which the thickness of the stop layer 3a was varied as parameter with a specified constant sum of the thicknesses of the n-type base layer 3 and the stop layer 3a.

Figure 3:
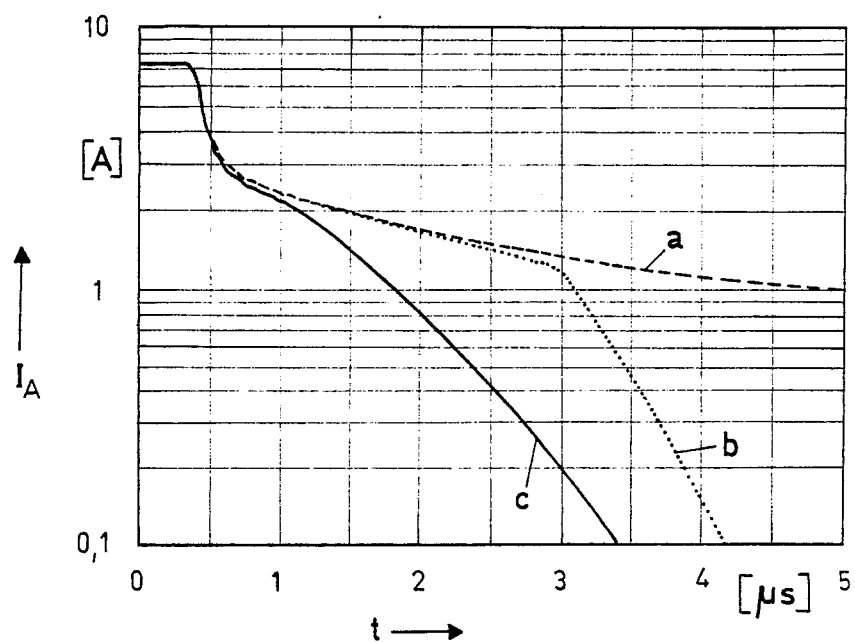
FIG. 3 shows results of simulation calculations for the current curve in the turn-off case of a model GTO with base layers of various thickness.

The results of these simulation calculations are shown in FIG. 3 as curves of the anode current $I_A$ as a function of the time t when the GTO is turned off. In this connection an on-state current of 7.3 A and an anode voltage of 1600 V were assumed. The following stop layer thicknesses were chosen for the three different curves a, b and c:

Curve a: 10 $\mu$m,
Curve b: 30 $\mu$m,
Curve c: 90 $\mu$m.

Because the sum of the thicknesses is constant, the increase in the thickness of the stop layer 3a corresponds to a corresponding decrease in the thickness of the n-type base layer 3.

From FIG. 3 it is now clearly evident that, as the thickness of the n-type base Layer 3 decreases, the anode current decreases increasingly more rapidly after the turn off. Whereas the corresponding turn-off time $T_f$ for curve a exceeds 5 $\mu$s, for curve b it decreases to 2.9 $\mu$s and for curve c finally to 1.7 $\mu$s, which corresponds to a contraction by a factor of more than 3.

Even from this it becomes clear that a reduction in the corresponding layer thickness results in substantial improvements in the electrical properties of the component.

The assumption made for the simulation calculations of a constant sum of the thicknesses of the n-type base layer 3 and stop layer 3a is an artificial restriction which is based on the special features of the underlying model.

The electrical properties of GTO or FCTh can in fact be improved by the fact that, with the thickness of the stop layer remaining constant, the n-type base layer and, consequently the semiconductor substrate as a whole, are made thinner. The component shown in FIG. 2 then becomes a component as shown in the cross section in FIG. 4.

On the cathode side, no cange has been introduced in the structure of the cathode fingers 8, in the cathode layers 5 and in the p-type base layer 4 compared with the conventional component in FIG. 2.

Figure 4:
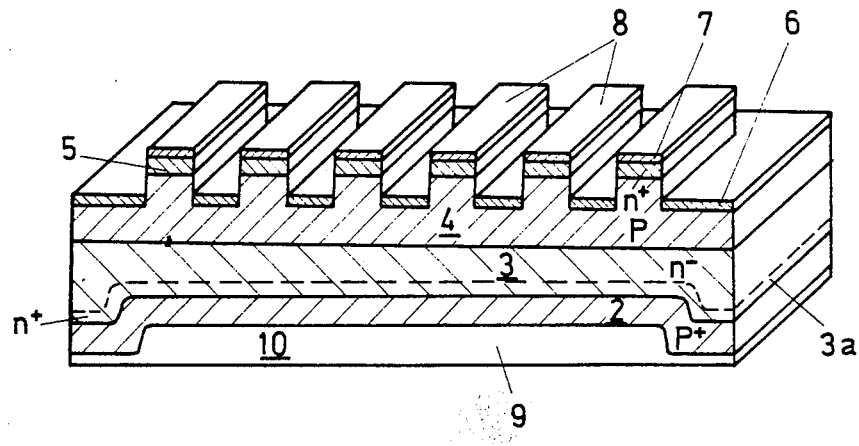
FIG. 4 shows the GTO of FIG. 2 with etch well on the anode side according to a preferred exemplary embodiment of the invention.

On the other hand, in the novel GTO of FIG. 4, the n-type base layer 3 is more thinly designed in the region of the cathode fingers 8 forming the control structure, while the thicknesses of the stop layer 3a and the anode Layer 2 have virtually not changed compared with FIG. 2.

The local thickness reduction is achieved by introducing a deep etch well 10 into the semiconductor substrate from the anode side. This etching may, for example, be carried out by means of the known process of reactive ion etching (RIE=Reactive Ion Etching) or by a suitable wet-chemical method (e.g. roller etching). In this connection it is important that the etching is carried out with the necessary uniformity in order to prevent thickness variations which cannot be tolerated. It is also mechanically and electrically beneficial if the etch well 10 has rounded edges at the bottom.

The etching expediently takes place on the n-doped initial substrate so that subsequently the stop layer 3a and the anode layer 2 can be diffused in.

For the mechanical stability of the substrate it is essential that the etching takes place in the form of the etch well 10 only locally in the regions which are opposite the control structure. In this manner ridge-like edges with the original thickness continue to exist and these form a mechanically stable frame around the etch well 10.

This is shown particularly clearly in the drawings of FIGS. 5A and 5B which show a prototype of a GTO viewed from the cathode and anode side (FIG. 5A and FIG. 5B respectively). In FIG. 5A, the control structure on the cathode side is clearly seen to consist of two groups of about 40 cathode fingers which are surrounded by the gate contact 6. At the edge of the component, a passivation 11 is indicated by its edge contour.

Seen from the anode side (FIG. 5B), directly opposite the control structure are provided two correspondingly extended etch wells 10 which effect a thickness reduction in the current-carrying part of the component. The etch wells 10 are in this case completely surrounded by the regions of original thickness with the shading drawn in.

The mechanical stability is further increased if, as can be seen in FIG. 4, the metallization completely fills up the etch well 10 in the case of the anode 9 so that the thickness reduction, viewed from the mechanical standpoint, is eliminated again. This takes place, for example, by filling in the well with solder when soldering the semiconductor substrate onto a base.

A further measure for increasing the mechanical stability may be explained by reference to FIG. 6. In components for higher currents (e.g. 100 A), the control structure on the cathode side can be subdivided into individual control zones 16 (designed, for example, for 10 A each), which are separated from each other. The larger etch wells on the anode side can then be subdivided into smaller ones so that new mechanically stable ridges are produced between the smaller etch wells 10.

FIG. 6 furthermore shows a solder layer 15 which fills up the etch well 10 and with which the semiconductor substrate 1 is soldered without cavities onto a metal substrate 14.

In the component shown in FIG. 6 the edge trenches 12, which are necessary in the case of the "moat" termination technique in the edge region, are indicated. In this case a particular advantage of the invention becomes clear: because the thickness reduction with the etch wells 10 leaves the edge region untouched, i.e. leaves it at its original thickness, no additional problems result in relation to the edge region in relation to the blocking capability.

Finally a cathode contact 13 is shown in FIG. 6 with which contact can be made to the cathode fingers 8 in the individual control zones 16.

In semiconductor components of the conventional type for reverse voltages between 1.2 kV and 3 kV thicknesses of the n-type base layer of about 200–250 μm have so far been reached. According to the present invention the thickness of the n-type base layer in the region of the etch well is now reduced to values less than 200 μm, preferably to values between 80 and 150 μm. Shorter switching times and reduced on-state dissipations are thereby achieved.

The novel technology of the deeply etched anode described on the basis of the example of the GTO or FCTh does not only produce advantages in this semiconductor component but also in others: thus, lower on-state dissipations can be achieved because of a lower thickness of the silicon substrate even in diodes and transistors with current flow taking place essentially axially. At the same time this results in the possibility of manufacturing MOSFETs and transistors with higher reverse voltage than about 1000 V.

Especially in the case of the diodes it may also be expedient in this connection to deeply etch the cathode instead of the anode or else both sides.

All in all, semiconductor components of very varied type with markedly improved electrical properties are therefore made available with the invention in a simple manner.

We claim:

1. A power semiconductor device comprising:
   a large-area semiconductor substrate of a first thickness;
   a plurality of differently doped layers provided within said substrate between an anode and a cathode with a thyristor layer sequence
   including an anode layer, a p-base layer, an n-base layer and a cathode layer, said layer sequence defining a thyristor which can be switched off via a gate;
   said cathode layer and p-base layer comprising a step-like gate-cathode structure, in which a plurality of cathode fingers project out of and are separated by a recessed gate plane thus forming a control structure, said control structure subdivided into a plurality of separated control zones, each of said control zones comprising a plurality of said cathode fingers;
   said first thickness of said semiconductor substrate being reduced by a plurality of deep etch wells introduced into said semiconductor substrate on the side of said anode opposite respective of said control zones, each etch well having an area approximately equal to the area of the control zone opposite thereto;
   said etch wells
   reducing said thickness over an area of said semiconductor substrate which comprises a plurality of said cathode fingers;
   said semiconductor substrate being soldered onto a metal substrate with said anode side; and
   said etch wells being completely filled in with solder.

2. A power semiconductor device according to claim 1, comprising:
   said anode layer being p-doped and said n-base layer being weakly n-doped; and
   said thickness reduction of said semiconductor substrate being correlated to a thickness reduction of said n-base layer.

3. A power semiconductor device according to claim 2, comprising
   a strongly n-doped stopping layer provided between said anode layer and said n-base layer.

4. A power semiconductor device according to claim 2, wherein said thickness reduction of said n-base layer leads to a thickness of said n-base layer of less than 200 μm.

* * * * *